United States Patent [19]

Suzuki et al.

[11] 4,316,785
[45] Feb. 23, 1982

[54] OXIDE SUPERCONDUCTOR JOSEPHSON JUNCTION AND FABRICATION METHOD THEREFOR

[75] Inventors: Minoru Suzuki; Toshiaki Murakami; Takahiro Inamura; Takashi Inukai; Youichi Enomoto, all of Mito, Japan

[73] Assignee: Nippon Telegraph & Telephone Public Corporation, Tokyo, Japan

[21] Appl. No.: 202,640

[22] Filed: Oct. 31, 1980

[30] Foreign Application Priority Data

Nov. 5, 1979 [JP] Japan .................................. 54-143126
Feb. 5, 1980 [JP] Japan ................................... 55-12027

[51] Int. Cl.³ ............................................ H01L 39/22
[52] U.S. Cl. .................................... 204/192 S; 357/5; 427/63; 29/599
[58] Field of Search ........................... 174/126 S, 68.5; 252/521; 427/62, 63, 124, 125; 204/192 S, 192 D; 357/5; 29/599

[56] References Cited

U.S. PATENT DOCUMENTS 3,932,315 1/1976 Sleight ................................. 252/521
4,176,365 11/1979 Kroger ................................. 357/5

OTHER PUBLICATIONS

Gilbert et al. Thin Solid Films, 54 (1978), 129-136.

*Primary Examiner*—Sam Silverberg
*Assistant Examiner*—Richard Bueker
*Attorney, Agent, or Firm*—Frishauf, Holtz, Goodman and Woodward

[57] ABSTRACT

A tunneling Josephson junction is disclosed in which first and second superposed superconducting electrode layers are formed of thin films of oxide superconducting materials having a perovskite structure of $BaPB_{1-x}Bi_xO_3$. A barrier layer interposed between these superconducting electrode layers is a thin film of long service life which is stable and breakdown free under heat cycles from room temperature to ultra low temperatures. This film is made of an oxide with perovskite structure which has the same crystal structure and thermal expansion coefficient as those of the first and second superconducting layers for functioning as an insulator or a semiconductor. The oxide with perovskite structure may be $BaSnO_3$, $Ba_{1-y}Sr_yPb_{1-x}Bi_xO_3$ (wherein $0 \leq x \leq 0.3$, $y > 0.3$) or $BaPb_{1-x}(A_{1-y}Bi_y)O_3$ (wherein A is at least one member selected from the group consisting of V, Nb, Ta and Sb; $0.1 \leq x \leq 0.3$; and $0 \leq y \leq 0.5$).

5 Claims, 20 Drawing Figures

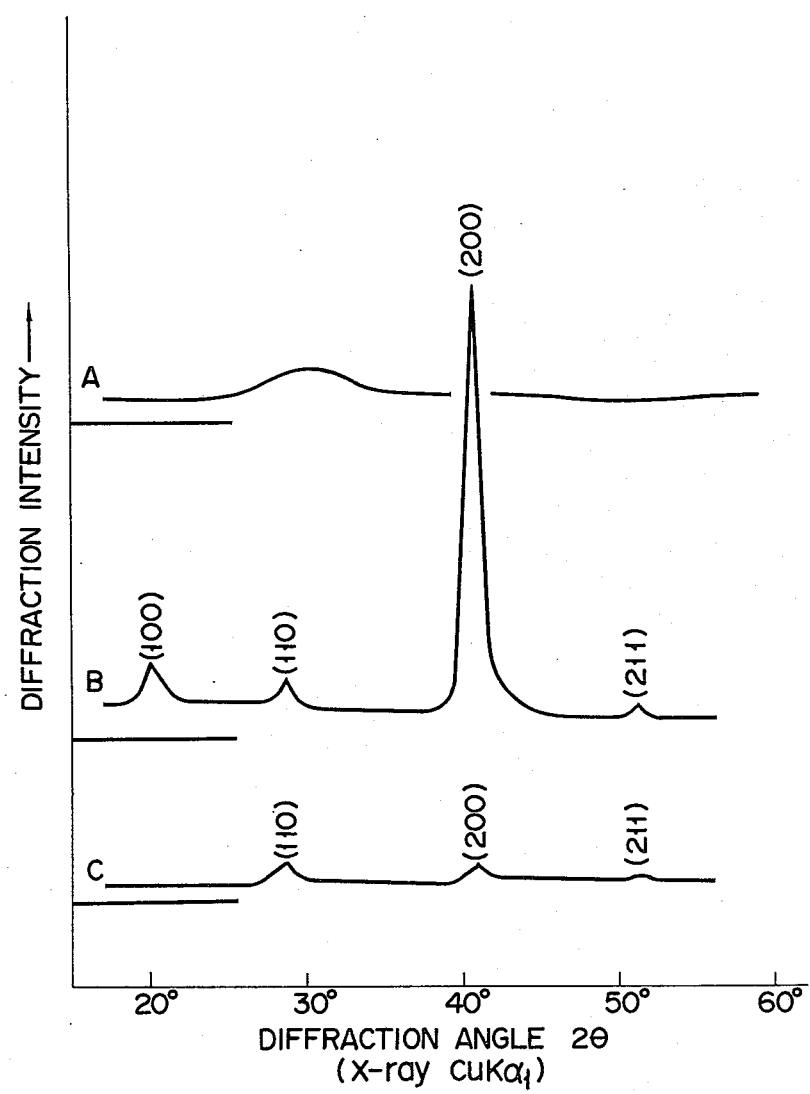

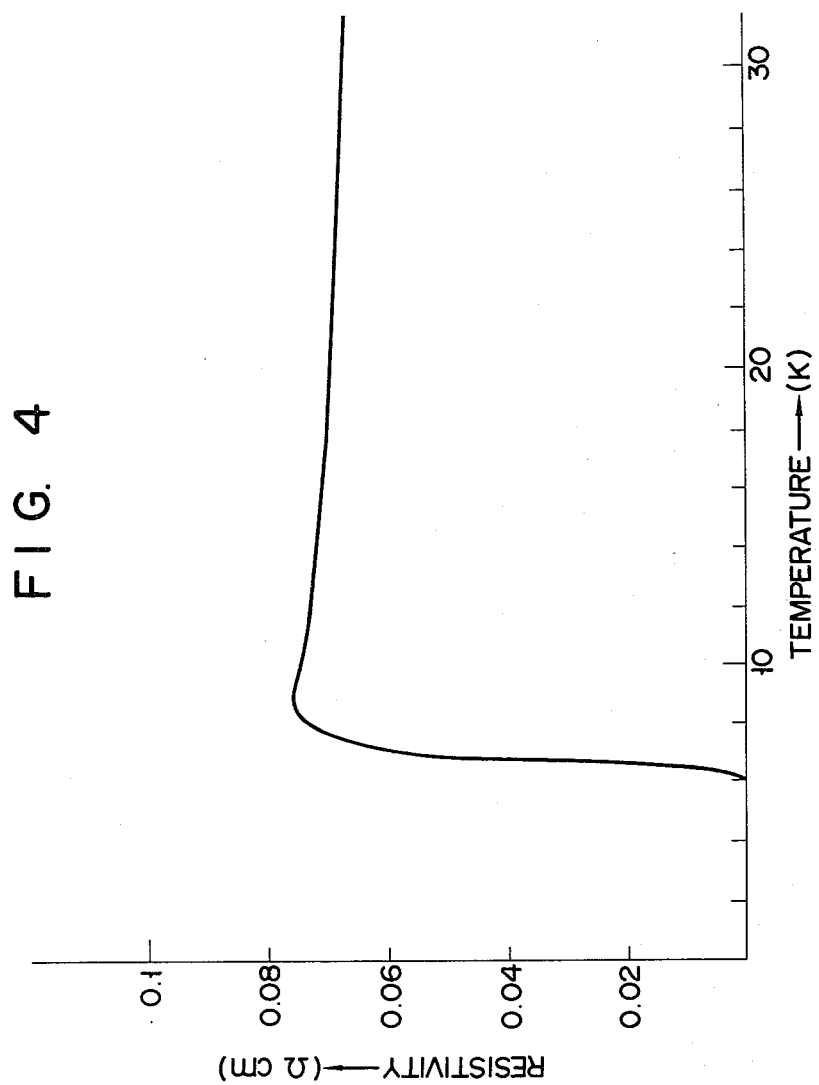

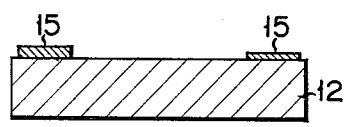
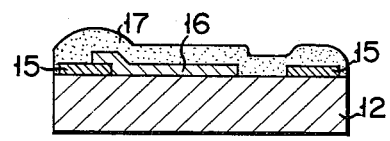
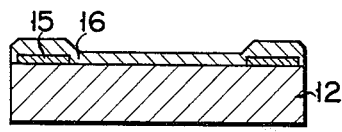
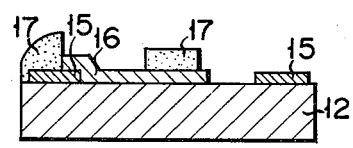
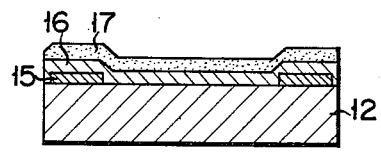
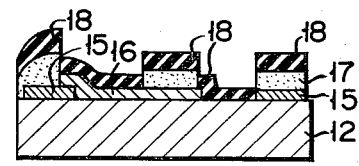
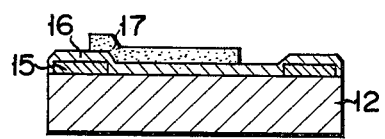
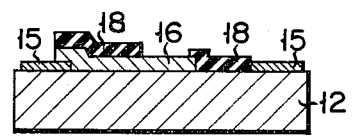
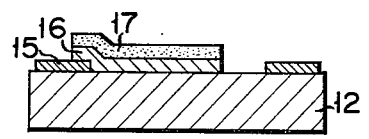
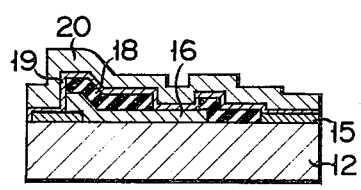
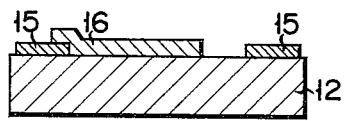

OXIDE SUPERCONDUCTOR JOSEPHSON JUNCTION AND FABRICATION METHOD THEREFOR

BACKGROUND OF THE INVENTION

The present invention relates to a tunneling Josephson junction of oxide superconductor and a fabrication method thereof.

A conventionally known tunneling Josephson junction uses as its superconducting material a Pb-In-Au alloy, a Pb-In-Sn alloy or a Pb-In alloy containing Pb as its main component. A Josephson junction is obtained by interposing a thin barrier layer of 20 to 30 Å thickness between two superconducting materials and weakly coupling them. Such a barrier layer is prepared by forming an ultra thin oxide layer on the surface of an alloy which is a superconducting material by thermal oxidation for oxidation in plasma discharge. For example, in the case of the Pb-In-Au alloy, a layer of $In_2O_3$ or PbO ($PbO_x$) is formed as a barrier layer on its surface.

The barrier layer and the superconducting materials are totally different crystallographically and have different thermal expansion coefficients. Due to this, the service life under heat cycles between room temperature and ultra low temperatures is about 500 cycles at maximum. After this limit, the oxide layer as the barrier layer breaks down.

Breakdown of the oxide layer as the barrier layer is related to the fact that the superconducting materials are soft metals whereas the oxide layer is hard. It follows, therefore, that breakdown of the barrier layer may be prevented if the superconducting materials are oxides as in the case of the barrier layer. As a prior art technique which uses oxides as the superconducting materials, U.S. Pat. No. 3,932,315 may be mentioned. This patent specification discloses that "compositions of the formula $Ba_{1-x}A_xPb_{1-y}Bi_yO_3$ are superconductors" but does not disclose any method for fabricating a tunneling Josephson junction, above all, a Josephson junction having a structure which realizes fine patterning and thinner film.

When an oxide superconducting material is composed of several kinds of elements, it is generally difficult to form a thin film by the conventional evaporation method. With the sputtering method under usual conditions, the surface becomes coarse, the film is amorphous, and a thin film of good quality is not obtainable. When this amorphous film is annealed at a temperature above the crystallization temperature, most of the elements constituting the thin film tend to evaporate. When Pb is included in these elements, it tends to form other lead oxides or react with the substrate so that a desired oxide superconducting electrode layer may only be formed in a small amount. Thus, with the conventional methods, the fabrication of thin films of oxide superconducting materials is still in the experimental stage, and thin films of good quality requiring fine structures for Josephson junctions have not been available.

SUMMARY OF THE INVENTION

The present invention has been made in consideration of this and has its object to provide an oxide superconductor Josephson junction in which a barrier layer interposed between the first and second superconducting electrode layers has a long service life, is stable under heat cycles from room temperature to ultra low temperatures or liquid helium temperatures and may be made thin in a stable manner.

An oxide superconductor Josephson junction of the present invention, for achieving the above object, comprises a first superconducting electrode layer consisting of an oxide with perovskite structure, i.e., $BaPb_{1-x}Bi_xO_3$ (wherein $0.05 \leq x \leq 0.3$); a barrier layer formed on said first superconducting electrode layer and consisting of one member selected from the group consisting of $BaSnO_3$, $Ba_{1-y}Sr_yPb_{1-x}Bi_xO_3$ (wherein $0 \leq x \leq 0.3$, $y > 0.3$), and $BaPb_{1-x}(A_{1-y}Bi_y)_xO_3$ (wherein A is at least one member selected from the group consisting of V, Nb, Ta and Sb; $0.1 \leq x \leq 0.3$; and $0 \leq y \leq 0.5$), all being oxides with perovskite structures; and a second superconducting electrode layer formed over said first superconducting electrode layer with said barrier layer interposed therebetween and consisting of an oxide with perovskite structure, i.e., $BaPb_{1-x}Bi_xO_3$ (wherein $0.05 \leq x \leq 0.3$) constituting a Josephson junction.

An oxide superconductor Josephson junction of the present invention is fabricated by a method comprising:

the step of forming a first superconducting electrode layer of a thin film of an oxide with perovskite structure, i.e., $BaPb_{1-x}Bi_xO_3$ (wherein $0.05 \leq x \leq 0.3$) including the steps of forming by sputtering a thin film of said $BaPb_{1-x}Bi_xO_3$ on a cooled substrate arranged in opposition to a ceramic target of an oxide with perovskite structure, i.e., $BaPb_{1-x}Bi_xO_3$ (wherein $0.05 \leq x \leq 0.3$) and annealing in an oxygen atmosphere the thin film of $BaPb_{1-x}Bi_xO_3$ formed in said steps to turn it into a superconducting material;

the step of forming a barrier layer on the surface of said first superconducting electrode layer under the condition that said substrate is cooled, said barrier layer consisting of one member selected from the group consisting of $BaSnO_3$, $Ba_{1-y}Sr_yPb_{1-x}Bi_xO_3$ (wherein $0 \leq x \leq 0.3$, $y > 0.3$) and $BaPb_{1-x}(A_{1-y}Bi_y)_xO_3$ (wherein A is at least one member selected from the group consisting of V, Nb, Ta and Sb; and $0 \leq y \leq 0.5$), all being oxides with perovskite structures; and the step of forming a second superconducting electrode layer of an oxide with perovskite structure, i.e., $BaPb_{1-x}Bi_xO_3$ (wherein $0.05 \leq x \leq 0.3$) including the steps of forming a thin film of said $BaPb_{1-x}Bi_xO_3$ by sputtering on the surface of said barrier layer under the condition that said substrate is cooled and annealing in an oxygen atmosphere the $BaPb_{1-x}Bi_xO_3$ thin film formed in said steps to turn it into a superconducting material. With the above-mentioned construction and steps, the oxide superconductor Josephson junction and the fabrication method therefor are technically improved in the following respects.

By forming a barrier layer of an oxide superconducting material having a perovskite structure between first and second oxide superconducting electrode layers also having perovskite structures, the thermal expansion coefficient of all three layers being the same, an oxide superconductor Josephson junction may be obtained which is stable and has a long service life under heat cycles from room temperature to ultra low temperatures or liquid helium temperatures. It is confirmed that a higher superconductivity transition temperature of 13 K may be obtained as compared with conventional Josephson junctions and fabrication methods, so that the power consumption for obtaining the superconducting state may be made smaller. Furthermore, since oxide materials are used for the first and second superconducting layers and the barrier layer in the fabrication method, the surfaces of the materials are not degraded in an oxygen atmosphere and the materials are stable during and after the fabrication steps.

By properly controlling the oxygen partial pressure in the atmosphere for forming by sputtering thin films as the first and second superconducting electrode layers and the barrier layer, thin crystalline films of good quality with smooth surfaces may be formed. Since the above-mentioned sputtering is performed on a cooled substrate and a crystalline thin film may be obtained at a low substrate temperature of less than 100° C., the patterning of conventional silicon techniques may be utilized and application of the present invention to integrated circuits is easy. The thin films of the oxide superconducting materials after sputtering is annealed for forming the superconducting electrodes. Laser irradiation may be used for annealing for the second superconducting electrode. This facilitates the fabrication of a desired oxide superconductor Josephson junction without adversely affecing the shape and characteristics of said barrier layer.

BRIEF DESCRIPTION OF THE DRAWINGS

FIG. 3 shows X-ray diffraction patterns of thin films obtained by sputtering under different pressures in atmospheres containing argon and oxygen;

FIG. 4 is a graph showing the temperature dependence of the resistivity of a thin film of $BaPb_{1-x}Bi_xO_3$ which is the superconducting electrode layer obtained in one embodiment of the present invention;

FIG. 5 is a sectional view showing a step for forming a bonding pad on a substrate in the fabrication method of an embodiment of the present invention;

FIGS. 6 to 10 are sectional views showing the steps for forming the first superconducting electrode layer;

FIGS. 11 to 14 are sectional views showing the steps for forming the insulating layer on said first superconducting electrode layer;

FIGS. 15 to 19 are sectional views showing the steps for sequentially laminating the barrier layer and the second superconducting electrode layer on said first superconducting electrode layer, through the insulating layer.

DETAILED DESCRIPTION OF THE PREFERRED EMBODIMENTS

Figure 1:
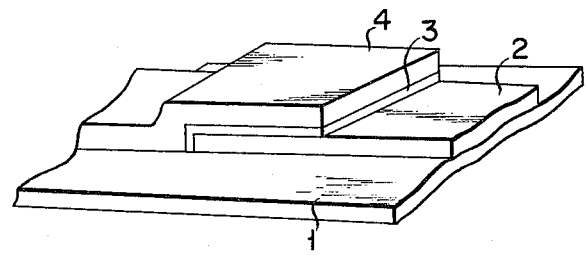
FIG. 1 is a schematic perspective view of a tunneling Josephson junction.

One embodiment of the present invention will now be described with reference to the accompanying drawings. FIG. 1 is a perspective view illustrating an in-line type tunneling Josephson junction wherein a band-shaped first superconducting electrode layer 2 is formed on a substrate 1. A band-shaped second superconducting electrode layer 4 overlaps the longitudinal front end of the first superconducting electrode layer 2 and extends from it in the longitudinal direction with a barrier layer 3 between the electrode layers.

For the first and second superconducting electrode layers 2 and 4, oxide superconducting materials having perovskite structure represented by $BaPb_{1-x}Bi_xO_3$ (wherein $0.05 \leq x \leq 0.3$) are used. Electrode layers formed in thin films from these materials show the semiconductive properties at room temperature and at ultra low temperatures. However, when such a layer is annealed, it shows metallic conduction at room temperature and superconductivity at ultra low temperatures.

For the barrier layer 3, an oxide with perovskite structure having the same crystal structure as that of the first and second superconducting electrode layers 2 and 4 is used, for example, $BaSnO_3$, $Ba_{1-y}Sr_yPb_{1-x}Bi_xO_3$, $Bi_xO_3$ (wherein $0 \leq x \leq 0.3$, $y>0.3$), or $BaPb_{1-x}(A_{1-y}Bi_y)_xO_3$ (wherein A is at least one member selected from the group consisting of V, Nb, Ta and Sb; $0.1 \leq x \leq 0.3$; and $0 \leq y \leq 0.5$).

Since all of the layers mentioned are oxides with perovskite structures, it is possible to match the thermal expansion coefficients and the lattice constants of the layers. By arranging it so that each layer has the same thermal expansion coefficient, it is possible to extend the service life under heat cycles from room temperature to ultra low temperatures.

Figure 2:
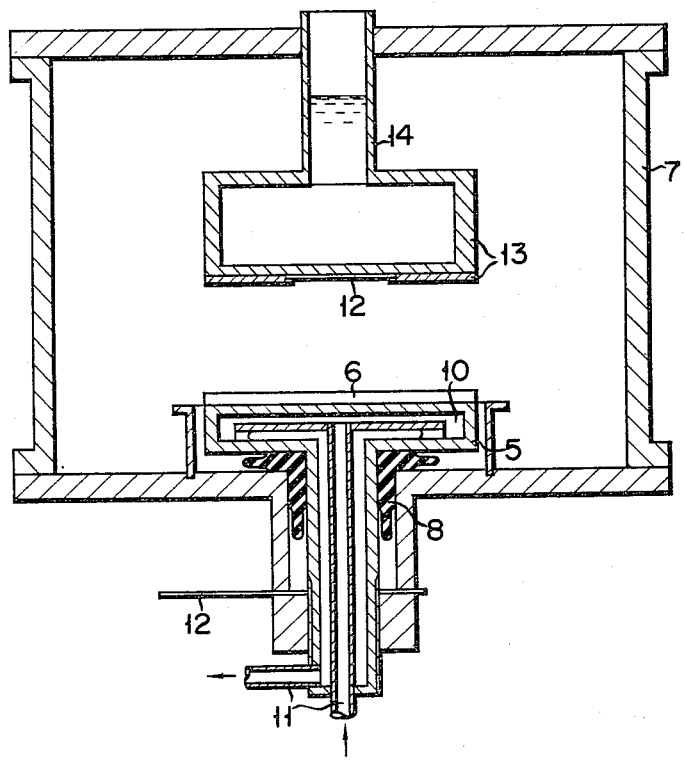
FIG. 2 is a sectional view of a sputtering chamber for forming a thin film of an oxide superconducting material according to an embodiment of the present invention.

The sputtering step for forming thin films for the first and second superconducting electrode layers 2 and 4 and the barrier layer 3, and the following annealing step for obtaining the superconducting electrode layers 2 and 4 will be described with reference to the sputtering device shown in FIG. 2 and the views of FIGS. 5 to 20 illustrating the fabrication procedures.

First, a ceramic target of an oxide superconducting material $BaPb_{1-x}Bi_xO_3$ ($0.05 \leq x \leq 0.3$) for forming the first and second superconducting electrode layers 2 and 4 is prepared. For obtaining the ceramic target, an intimate mixture of $BaCO_3$, $PbO_2$ and $Bi_2O_3$ is prepared in a suitable ratio such as 78.94 g, 71.76 g and 23.30 g, respectively. The mixture is heated to a temperature of about 800° C. for 2 hours to react in an oxygen atmosphere. The reactant powder thus obtained is pressed into a disk shape and sintered at about 880° C. for 8 hours in an oxygen atmosphere to provide a ceramic target 6. The ceramic target 6 is placed on an electrode 5 of a sputtering device, as shown in FIG. 2. The sputtering device includes a stainless steel electrode 5 which extends through the bottom of a chamber 7 and on which is placed the ceramic target 6 with an insulator 8 placed between the electrode 5 and the chamber 7 for insulation. A space 10 is formed inside the electrode 5 and this space 10 communicates with the outside of the chamber 7 through a pipe 11. Water is circulated through the pipe 11 and the space 10. A Cu plate 12 is attached to the electrode 5 at outside the chamber 7, and a radio frequency (RF) high voltage from a radio frequency high voltage source (not shown) is applied to the Cu plate 12. A holder 13 for supporting a substrate 12 consisting of sapphire, silicon, glass or the like is disposed in the chamber 7 in opposition to the ceramic target 6. The holder 13 supports the substrate 12 at its outer walls and is constructed in a container-shape in which is contained liquid nitrogen 14 for cooling the substrate 12. With the eramic target 6 of $BaPb_{1-x}Bi_xO_3$ placed on the electrode 5 of the chamber 7 of the sputtering device of the construction described above, a crystalline thin film of good qualiy is formed on the substrate 12 by sputtering under the following conditions. The oxygen content in the argon and oxygen mixed gas atmosphere in the chamber 7 is assumed to be 10 to 50%. The pressure is $4 \times 10^{-2}$ Torr to $10 \times 10^{-2}$ Torr, the applied voltage is 1 to 2 kV and the substrate 12 is cooled to 60 to 120° C. by the liquid nitrogen 14 or water. Liquid nitrogen is mainly used for sputtering for formation of the barrier layer. The deposition rate under such conditions is 80 to 100 Å/min.

When the pressure in the chamber exceeds the predetermined value, the thin film becomes amorphous and the deposition rate becomes too low, thus providing an impractical method. When the pressure is below the predetermined value, the crystalline property is degraded and the surface of the thin film becomes coarse. The optimal range of the above-mentioned chamber pressure has been confirmed by X-ray diffractiometry, as shown in FIG. 3. In this figure, curve A is an X-ray diffraction pattern of a thin film of 300 nm thickness formed at an atmosphere pressure of $10 \times 10^{-2}$ Torr. No diffraction peak is observed, and it is seen that this film is amorphous. Curve B is an X-ray diffraction pattern of a thin film of 680 nm thickness formed at an atmosphere pressure of $6 \times 10^{-2}$ Torr. A diffraction peak is observed and shows crystalline structure oriented toward the direction (200). If this thin film is annealed at 500° C. for 12 hours in air, the cubic system lattice constant drops from 439 pm to 429 pm and the crystalline property is improved. Curve C shows a diffraction pattern of a thin film of 890 nm thickness formed at an atmosphere pressure of $2 \times 10^{-2}$ Torr. Its crystalline property is seen to be inferior to that of the corresponding film of curve B. When the thin films of the curves C and A are annealed, a diffraction peak is observed for the $BaPb_{1-x}Bi_xO_3$ film itself as well as for lead oxide, and a good crystalline structure thus cannot be observed. Among the sputtering conditions, when the applied radio frequency voltage is too low, no discharge is effected. When it is too high, the electric power output per unit area becomes too great, resulting in breakdown of the target. A voltage of 1 to 2 kV is suitable. It has also been confirmed that with a substrate temperature of about 60° to 120° C., the resistivity is low, Tc is high, and a thin film of good electrical characteristics such as sharp transition is obtained.

The thin film formed on the substrate in the manner described above is annealed in an electric furnace at 500° to 550° C. for 12 hours in air for rendering it superconducting to provide the first superconducting electrode layer. FIG. 4 shows the temperature dependence of the resistivity of the first superconducting electrode rendered superconducting by annealing. It is seen from this figure that a sharp superconducting transition is effected at 10 K, rendering the film superconducting.

The steps for forming the first superconducting electrode layer for actual fabrication of the tunneling Josephson junction will be described with reference to FIGS. 5 to 10.

As shown in FIG. 5, a bonding pad 15 as a connecting terminal is formed on the substrate 12 consisting of quartz or the like. This bonding pad 15 is formed by washing the substrate 12, evaporating Cr and depositing it in a predetermined pattern to a thickness of 500 Å, and depositing Au to a thickness of 3,000 Å.

Then, using the sputtering device described above, a $BaPb_{0.75}Bi_{0.25}O_3$ layer 16 is deposited to a thickness of 5,000 Å on the substrate 12, partially covering the bonding pad as shown in FIG. 6. Thereafter, annealing is performed to render the film superconducting. A photoresist 17 is painted to a thickness of 5,000 Å on the surface of the $BaPb_{0.75}Bi_{0.25}O_3$ layer 16 and is baked at 80° C. for 20 minutes. A predetermined part of the surface of the photoresist 17 is exposed, the other part being covered by a mask. The unexposed part is immersed in an AZ developer for 30 seconds. After rinsing with water for 30 seconds, the photoresist 17 is baked at 120° C. for 20 minutes to remove the predetermined part of the photoresist 17 as shown in FIG. 8. As shown in FIG. 9, the $BaPb_{0.75}Bi_{0.25}O_3$ layer 16 is etched with a 10% hydrochloric acid aqueous solution for 10 seconds. Then, as shown in FIG. 10, the remaining photoresist 17 is removed with acetone to form the first superconducting electrode layer 16.

The steps for forming the insulating layer for insulating the second superconducting electrode layer to be described later from the first superconducting electrode layer 16 formed in the manner as described above will be described with reference to FIGS. 11 to 14. As shown in FIG. 11, the entire surface of the first superconducting electrode layer 16 and parts of the surface of the bonding pad 15 and the substrate 12 are covered with a photoresist 18 painted to 1.5 μm thickness. The photoresist 18 is then baked at 80° C. and a predetermined part of it is exposed, the rest being covered by a mask. The photoresist 17 is immersed in an AZ developer. After developing and rinsing with water for 30 seconds, it is baked at 120° C. for 20 minutes for removing the predetermined part of the photoresist 17 as shown in FIG. 12. Then, as shown in FIG. 13, a layer of $SiO_2$ 18 is deposited by sputtering in a vacuum to a thickness of 3,000 to 5,000 Å. As shown in FIG. 14, the laminated part of the remaining photoresist 17 is removed with acetone to form the insulating layer 18.

The formation of a barrier layer 19 directly or indirectly junctioned with the first superconducting electrode layer 16 through the insulating layer 18 will be described. An oxide with perovskite structure to be used as the barrier layer, for example, $BaSnO_3$, is prepared in the following manner. $BaCO_3$ in an amount of 78.94 g and $SnO_2$ in an amount of 60.28 g are mixed together and reacted at 900° C. for 4 hours in air. The mixture is hot-pressed at 1,000° C. and 200 kg/cm² to provide a target. This target undergoes sputtering with the sputtering device shown in FIG. 2 which is similarly used in the formation of the thin film for the superconducting electrode. The oxygen content of the argon and oxygen mixture gas atmosphere in the chamber 7 is 10%, and the atmosphere pressure is $10^{-1}$ Torr. A radio frequency high voltage is applied between the chamber 7 and the electrode 9 to effect sputtering of 40 Å/min for forming the barrier layer 19 of 10 to 40 Å thickness to act as an insulator on the surface of the first superconducting electrode layer 16 and the insulating layer 18 which have already been formed on the substrate 12 cooled with liquid nitrogen.

For the barrier layer is used another oxide with perovskite structure $Ba_{1-y}Sr_yPb_{1-x}Bi_xO_3$ ($0 \leq x \leq 0.3$, $y > 0.3$) or $BaPb_{1-x}(A_{1-y}Bi_y)_xO_3$ (wherein A is at least one member selected from the group consisting of V, Nb, Ta and Sb; $0 \leq x \leq 0.3$; and $0 \leq y \leq 0.5$). The barrier layer is formed to a thickness of 100 to 500 Å and acts as a semiconductor.

Figure 16:
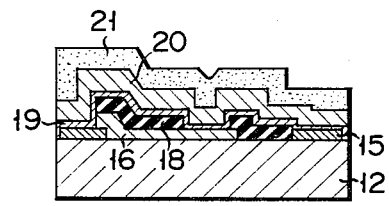
Figure 17:
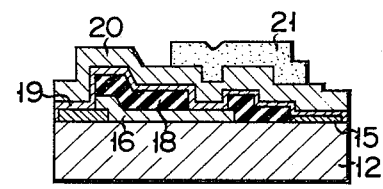
Figure 18:
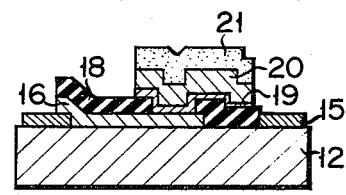
Figure 19:
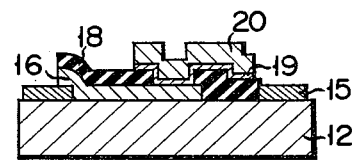
Figure 20:
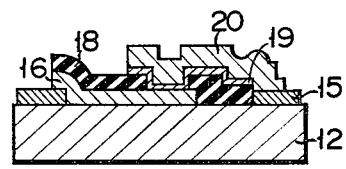
FIG. 20 is a sectional view showing a step for wiring said second superconducting electrode layer to said bonding pad.

Steps for formation of the barrier layer 19 and the formation of a second superconducting electrode layer 20 thereover will be described with reference to FIGS. 15 to 20. On the entire surface of the barrier layer 19 is deposited a layer 20 of an oxide with perovskite structure, $BaPb_{0.75}Bi_{0.25}O_3$ by sputtering as shown in FIG. 15. Then, as shown in FIG. 16, a photoresist 21 is painted on the surface of the $BaPb_{0.75}Bi_{0.25}O_3$ layer 20 to a thickness of 5,000 Å and is baked at 80° C. for 20 minutes. A predetermined part of the surface of the photoresist 21 is exposed, the rest being covered by a mask. The unexposed part is immersed in an AZ developer for 30 seconds for developing. After rinsing with water, baking at 120° C. is performed for 20 minutes to remove the predetermined part of the photoresist 21. As shown in FIG. 18, the unnecessary parts of the barrier layer 19 and the overlying $BaPb_{0.75}Bi_{0.25}O_3$ layer 20 are removed by etching in a 10% aqueous hydrochloric solution for 10 seconds. Then, the remaining photoresist 21 is removed with acetone, as shown in FIG. 19, to form the second electrode layer 20. The connection between the bonding pad 15 and the second electrode layer 20 is performed by evaporation with lift off as shown in FIG. 20.

Finally, the $BaPb_{0.75}Bi_{0.25}O_3$ second electrode layer 20 is annealed at 500° C. for 12 hours in air to render the film superconducting, and the second superconducting electrode layer is thus completed. The annealing process for forming the second superconducting electrode layer may be performed in a short period of time by irradiation by an argon laser of about 10 W output. This leads to prevention of diffusion of ions between the layers so that a Josephson junction of excellent characteristics may be obtained.

Although the above embodiment has been described with reference to a so-called in-line tunneling Josephson junction and a fabrication method therefor, the present invention may similarly be applied to a cross-line tunneling Josephson junction and a fabrication method therefor wherein the first and second superconducting layers extend perpendicularly to each other. It is thus to be understood that many modifications and changes may be made without departing from the spirit and scope of the present invention.

What we claim is:

1. An oxide superconductor Josephson junction comprising a first superconducting electrode layer consisting of $BaPb_{1-x}Bi_xO_3$ (wherein $0.05 \leqq x \leqq 0.3$) which is an oxide with perovskite structure; a barrier layer formed on said first superconducting electrode layer and consisting of one member selected from the group consisting of $BaSnO_3$, $Ba_{1-y}Sr_yPb_{1-x}Bi_xO_3$ (wherein $0 \leqq x \leqq 0.3$, $y > 0.3$), and $BaPb_{1-x}(A_{1-y}Bi_y)_xO_3$ (wherein A is at least one member selected from the group consisting of V, Nb, Ta and Sb; $0.1 \leqq x \leqq 0.3$; and $0 \leqq y \leqq 0.5$), all being oxides with perovskite structures; and a second superconducting electrode layer formed over said first superconducting electrode layer with said barrier layer between and consisting of $BaPb_{1-x}Bi_xO_3$ (wherein $0.05 \leqq x \leqq 0.3$) which is an oxide with perovskite structure.

2. A method of fabricating an oxide superconductor Josephson junction comprising:

the steps of forming a bonding pad by depositing Cr or Au by evaporation on part of a substrate;

the step of forming a first superconducting electrode layer of a thin film of $BaPb_{1-x}Bi_xO_3$ (wherein $0.05 \leqq x \leqq 0.3$) which is an oxide with perovskite structure including the steps of forming by sputtering a thin film of said $BaPb_{1-x}Bi_x)O_3$ on a cooled substrate arranged in opposition to a ceramic target of $BaPb_{1-x}Bi_xO_3$ (wherein $0.05 \leqq x \leqq 0.3$) which is an oxide with perovskite structure and annealing the thin film of $BaPb_{1-x}Bi_xO_3$ formed in said steps to turn it into a superconducting material;

the step of forming a barrier layer on the surface of said first superconducting electrode layer under the condition that said substrate is cooled, said barrier layer consisting of one member selected from the group consisting of $BaSnO_3$, $Ba_{1-y}Sr_yPb_{1-x}Bi_xO_3$ (wherein $0 \leqq x \leqq 0.3$, $y > 0.3$) and $BaPb_{1-x}(A_{1-y}Bi_y)_xO_3$ (wherein A is at least one member selected from the group consisting of V, Nb, Ta and Sb; and $0 \leqq y \leqq 0.5$), all being oxides with perovskite structures;

the step of forming a second superconducting electrode layer of $BaPb_{1-x}Bi_xO_3$ (wherein $0.05 \leqq x \leqq 0.3$) which is an oxide with perovskite structure including the steps of forming a thin film of said $BaPb_{1-x}Bi_xO_3$ by sputtering on the surface of said barrier layer under the condition that said substrate is cooled and annealing the $BaPb_{1-x}Bi_xO_3$ thin film formed in said steps to turn it into a superconducting material; and the step of connecting said bonding pad and said second superconducting electrode layer including the step of depositing by lift off evaporation between said bonding pad and said second superconducting electrode layer $BaPb_{1-x}Bi_xO_3$ which is an oxide with perovskite structure and the step of annealing $BaPb_{1-x}Bi_xO_3$ thus deposited for rendering the same superconducting.

3. The method according to claim 2 wherein the steps of forming a thin film of $BaPb_{1-x}Bi_xO_3$ by sputtering in the steps of forming said first and second superconducting electrode layers, the sputtering is performed under the conditions of, atmosphere gas: an argon and oxygen mixture gas with an oxygen content of 10 to 50%;

atmosphere pressure: $4 \times 10^{-2}$ Torr to $10 \times 10^{-2}$ Torr;

applied radio frequency voltage: 1 to 2 kV;

deposition rate: 80 to 100 Å/min; and substrate temperature: 60° to 120° C. as water-cooled.

4. The method according to claim 2 wherein the step of annealing the thin film of $BaPb_{1-x}Bi_xO_3$ and is to anneal the thin film at 500° to 550° C. in an oxygen atmosphere.

5. The method according to claim 2 wherein the step of rendering the thin film of $BaPb_{1-x}Bi_xO_3$ superconducting is to irradiate the thin film with an argon layer beam.

* * * * *